(12) United States Patent
Pan et al.

(10) Patent No.: US 9,559,045 B2
(45) Date of Patent: Jan. 31, 2017

(54) PACKAGE STRUCTURE AND METHOD FOR MANUFACTURING THE SAME

(71) Applicant: Unimicron Technology Corp., Taoyuan (TW)

(72) Inventors: Pi-Te Pan, Taoyuan (TW); Chang-Fu Chen, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 14/799,593

(22) Filed: Jul. 15, 2015

(65) Prior Publication Data
US 2016/0343645 A1 Nov. 24, 2016

(30) Foreign Application Priority Data
May 22, 2015 (TW) .............................. 104116526 A

(51) Int. Cl.
*H01L 23/00* (2006.01)
*H01L 23/36* (2006.01)
*H01L 23/498* (2006.01)
*H01L 21/48* (2006.01)

(52) U.S. Cl.
CPC ....... *H01L 23/49811* (2013.01); *H01L 21/481* (2013.01); *H01L 23/49827* (2013.01); *H01L 24/81* (2013.01)

(58) Field of Classification Search
CPC .... H01L 23/498; H01L 25/0657; H01L 23/00; H01L 23/36; H01L 23/488; H01L 23/495; H01L 2924/14; H01L 2924/01079; H01L 2924/01029; H01L 2924/01013
USPC ............... 257/737, 690, 734, 735, 736, 781, 738, 257/777, 778
See application file for complete search history.

(56) References Cited

U.S. PATENT DOCUMENTS

| | | | |
|---|---|---|---|
| 2003/0022477 A1* | 1/2003 | Hsieh | H01L 21/4853 438/612 |
| 2004/0084206 A1* | 5/2004 | Tung | H01L 21/4853 174/255 |
| 2006/0201997 A1* | 9/2006 | Tung | H01L 21/4853 228/101 |
| 2007/0187711 A1* | 8/2007 | Hsiao | H01L 27/14618 257/100 |
| 2011/0147911 A1* | 6/2011 | Kohl | H01L 21/6835 257/686 |
| 2015/0097277 A1* | 4/2015 | Chen | H01L 23/3135 257/668 |

FOREIGN PATENT DOCUMENTS

| | | |
|---|---|---|
| TW | 200307494 | 12/2003 |
| TW | 200828536 | 7/2008 |
| TW | 201041472 | 11/2010 |

OTHER PUBLICATIONS

"Office Action of Taiwan Counterpart Application", issued on Nov. 30, 2016, p. 1-p. 13.

* cited by examiner

*Primary Examiner* — Chuong A Luu
(74) *Attorney, Agent, or Firm* — Jianq Chyun IP Office

(57) ABSTRACT

Provided is a package structure including a circuit board, a plurality of first contact pads, a plurality of metal pillars and at least one chip. The first contact pads are disposed on the circuit board. The chip is disposed on one portion of the first contact pads. The metal pillars are disposed on the other portion of the first contact pads, where the chip is surrounded by the metal pillars. A method for manufacturing the package structure is also provided.

10 Claims, 11 Drawing Sheets

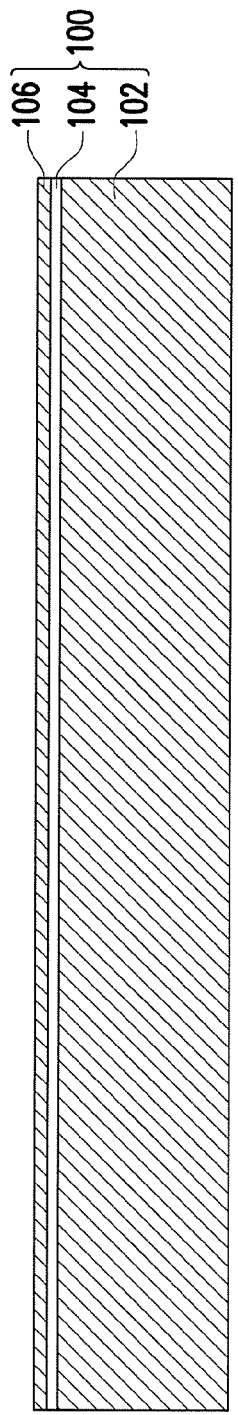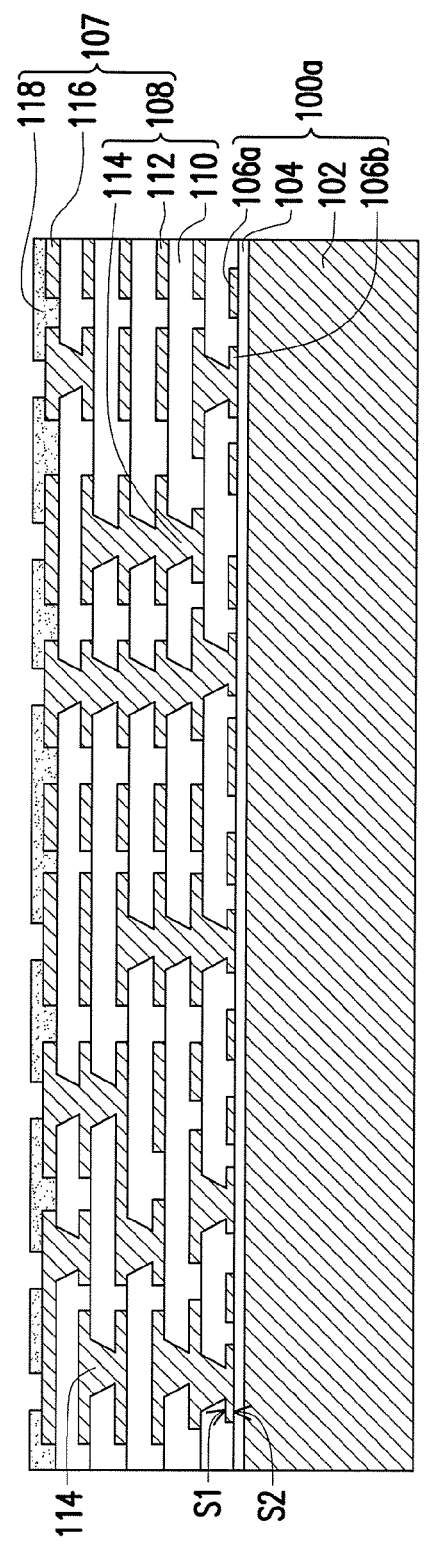
FIG. 1A
FIG. 1B

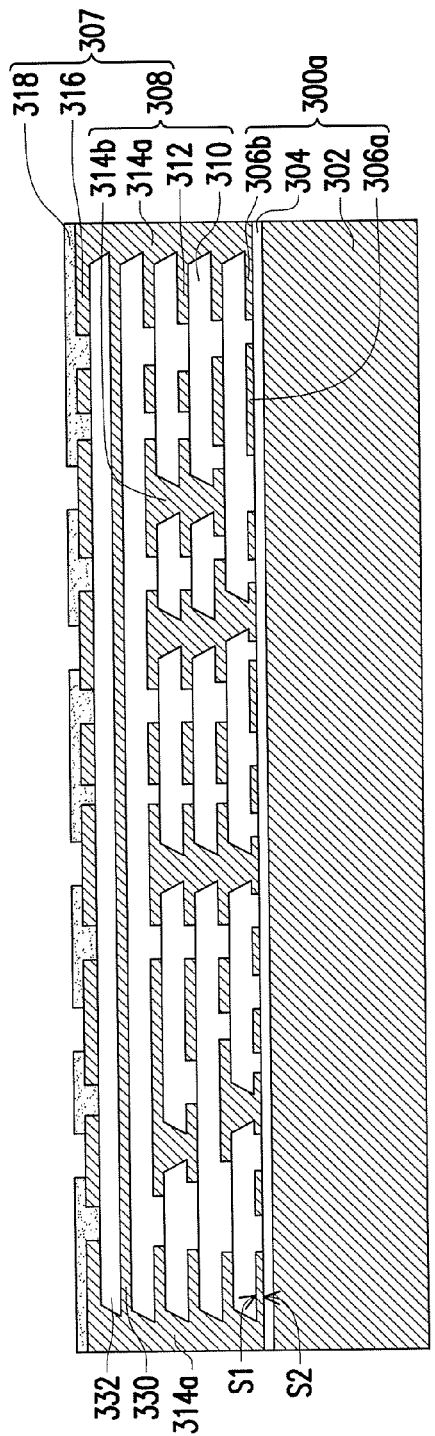
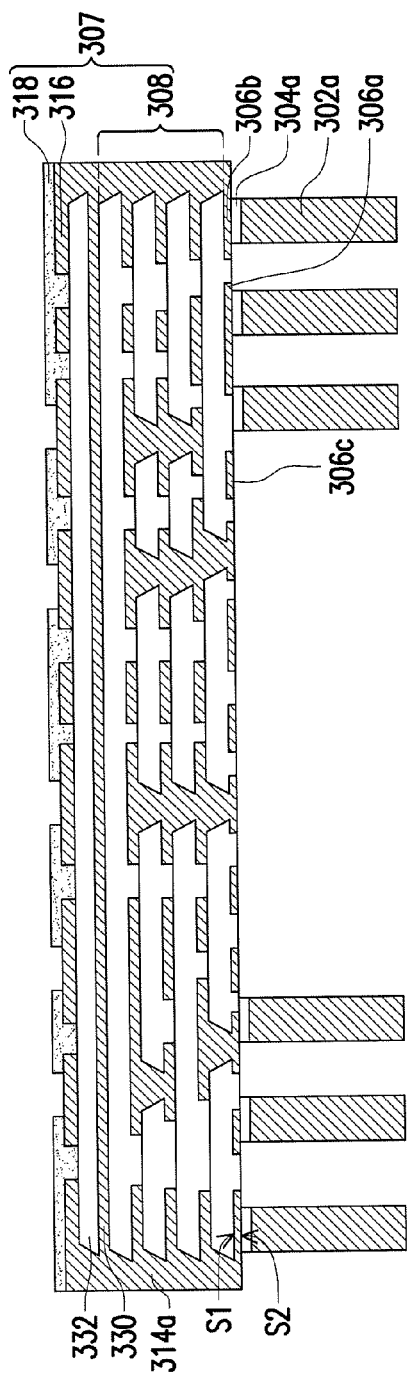
FIG. 4A
FIG. 4B

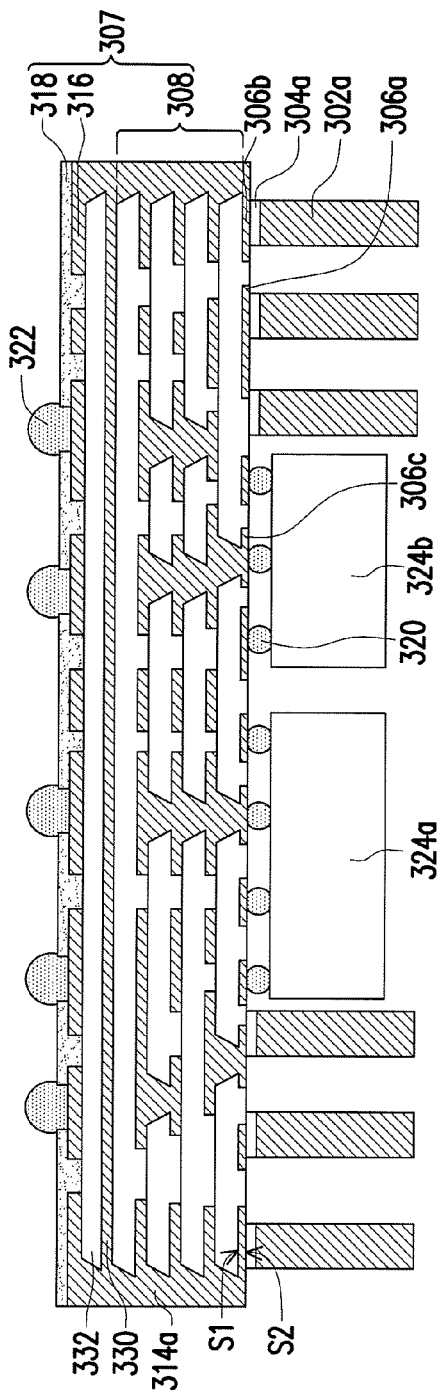
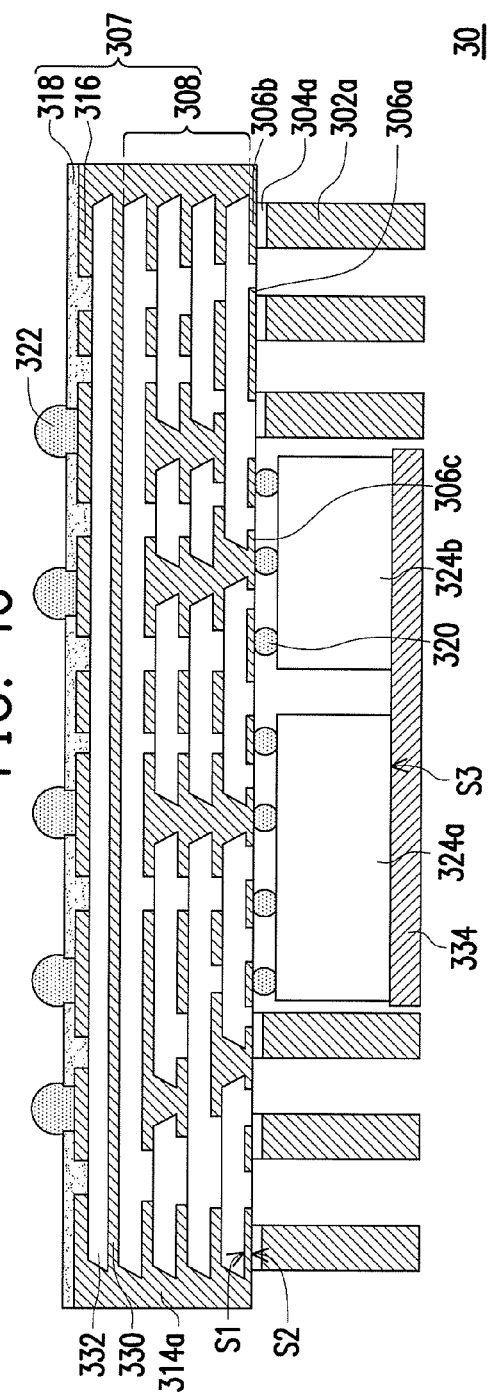
FIG. 4C
FIG. 4D

PACKAGE STRUCTURE AND METHOD FOR MANUFACTURING THE SAME

CROSS-REFERENCE TO RELATED APPLICATION

This application claims the priority benefit of Taiwan application serial no. 104116526, filed on May 22, 2015. The entirety of the above-mentioned patent application is hereby incorporated by reference herein and made a part of this specification.

BACKGROUND OF THE INVENTION

Field of the Invention

The invention relates to a semiconductor structure and a method for manufacturing the same, and particularly relates to a three-dimensional package structure and a method for manufacturing the same.

Description of Related Art

In recent years, in order to increase applications of printed circuit board (PCB), the PCB is fabricated into a multi-layer circuit structure according to many techniques. A method for fabricating the multi-layer circuit structure is to construct a build-up structure by using copper foils or other suitable conductive materials and prepreg (PP) or other suitable dielectric materials, and repeatedly laminate the build-up structure for stacking on a core layer, so as to form the multi-layer circuit structure, by which an internal wiring space of the multi-layer circuit structure is increased. The conductive material on the build-up structure can construct a conductive circuit according to a required circuit layout, and blind holes or through holes of the build-up structure can be filled with a conductive material for conducting each of the layers. In this way, the number of the circuit layers of the multi-layer circuit structure can be adjusted according to an actual requirement, and the multi-layer circuit structure can be manufactured according to the above method.

However, since the prepreg or the other suitable dielectric material is relatively soft, a warpage issue of the multi-layer circuit structure is probably encountered during the manufacturing process thereof. When the above PCB is applied to a package-on-package (POP) structure, the POP structure may also have the warpage issue, by which a yield of the POP structure is decreased.

SUMMARY OF THE INVENTION

The invention is directed to a three-dimensional (3D) package structure and a method for manufacturing the same, by which a warpage issue of the 3D package structure is resolved, and a yield thereof is increased.

The invention provides a package structure including a circuit board, a plurality of first contact pads, a plurality of metal pillars and at least one chip. The first contact pads are disposed on the circuit board. The chip is disposed on one portion of the first contact pads. The metal pillars are disposed on the other portion of the first contact pads, where the metal pillars surround the chip.

In an embodiment of the invention, the circuit board includes a build-up structure, second contact pads and a solder mask layer. The second contact pads are disposed between the build-up structure and the solder mask layer. The build-up structure includes a plurality of dielectric layers, a plurality of patterned circuit layers and a plurality of first conductive through vias. Each of the patterned circuit layers is disposed between the adjacent dielectric layers. The first conductive through vias are disposed in the dielectric layer for electrically connecting the adjacent patterned circuit layers.

In an embodiment of the invention, the package structure further includes a supporting structure disposed in the circuit board. The supporting structure includes a vertical supporting structure and a horizontal supporting structure.

In an embodiment of the invention, the vertical supporting structure has a plurality of second conductive through vias disposed in the dielectric layer and disposed around the circuit board. The second conductive through vias are aligned to each other to form a continuous structure.

In an embodiment of the invention, the package structure further includes a first heat dissipation structure disposed between the build-up structure and the second contact pads. The first heat dissipation structure is electrically connected to the vertical supporting structure to form an inverted U-shape structure.

In an embodiment of the invention, the patterned circuit layer has a main pattern and a supporting pattern. The supporting pattern is disposed around the main pattern to form the horizontal supporting structure. The supporting pattern is a mesh pattern.

In an embodiment of the invention, the package structure further includes a second heat dissipation structure disposed on the chip.

In an embodiment of the invention, a material of the second heat dissipation structure includes silver, nickel, copper, aluminium, gold, palladium or a combination thereof.

In an embodiment of the invention, the package structure further includes an insulating structure disposed on the first contact pads. The insulating structure does not cover a surface of the chip.

In an embodiment of the invention, a material of the insulating structure includes epoxy, polyimide or a combination thereof.

In an embodiment of the invention, the package structure further includes a plurality of bumps and a plurality of etching stop layers. The bumps are disposed between the first contact pads and the chip. The etching stop layers are disposed between the first contact pads and the metal pillars.

The invention provides a method for manufacturing a package structure, which includes following steps. A substrate is provided. The substrate includes a first metal layer, a second metal layer and an etching stop layer. The etching stop layer is disposed between the first metal layer and the second metal layer. The second metal layer is patterned to form a plurality of first contact pads. A circuit board is formed on a first surface of the first contact pads. The first metal layer is patterned to form a plurality of metal pillars. The etching stop layer that is not covered by the metal pillars is removed to expose a second surface of the first contact pads. The metal pillars are electrically connected to the circuit board through the first contact pads and the etching stop layer covered by the metal pillars. At least one chip is formed on the second surface of the first contact pads, where the metal pillars surround the chip.

In an embodiment of the invention, the circuit board includes a build-up structure, second contact pads and a solder mask layer. The second contact pads are disposed between the build-up structure and the solder mask layer. The build-up structure includes a plurality of dielectric layers, a plurality of patterned circuit layers and a plurality of first conductive through vias. Each of the patterned circuit layers is disposed between the adjacent dielectric layers. The first conductive through vias are disposed in the dielectric layer for electrically connecting the adjacent patterned circuit layers.

In an embodiment of the invention, the method for manufacturing the package structure further includes forming a supporting structure in the circuit board. The supporting structure includes a vertical supporting structure and a horizontal supporting structure.

In an embodiment of the invention, the vertical supporting structure has a plurality of second conductive through vias disposed in the dielectric layer and disposed around the circuit board. The second conductive through vias are aligned to each other to form a continuous structure.

In an embodiment of the invention, the method for manufacturing the package structure further includes forming a first heat dissipation structure between the build-up structure and the second contact pads. The first heat dissipation structure is electrically connected to the vertical supporting structure to form an inverted U-shape structure.

In an embodiment of the invention, the patterned circuit layer has a main pattern and a supporting pattern. The supporting pattern is disposed around the main pattern to form the horizontal supporting structure. The supporting pattern is a mesh pattern.

In an embodiment of the invention, the method for manufacturing the package structure further includes forming a second heat dissipation structure on a third surface of the chip.

In an embodiment of the invention, the method for manufacturing the package structure further includes forming an insulating structure on the second surface of the first contact pads. The insulating structure does not cover the third surface of the chip.

In an embodiment of the invention, the method for manufacturing the package structure further includes forming a plurality of bumps between the first contact pads and the chip.

According to the above descriptions, the supporting structure disposed in the circuit board and the insulating structure disposed on the second surface of the first contact pads are used to enhance the strength of the package structure, so as to resolve the warpage issue of the package structure to further improve a yield of the package structure. Moreover, the first heat dissipation structure and the second heat dissipation structure are adopted in the invention, by which not only a temperature of the package structure is decreased, but also the strength of the package structure is further enhanced.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

FIG. 1A to FIG. 1D are cross-sectional views of a manufacturing process of a package structure according to a first embodiment of the invention.

FIG. 4A to FIG. 4D are cross-sectional views of a manufacturing process of a package structure according to a third embodiment of the invention.

DESCRIPTION OF EMBODIMENTS

Figure 1C:
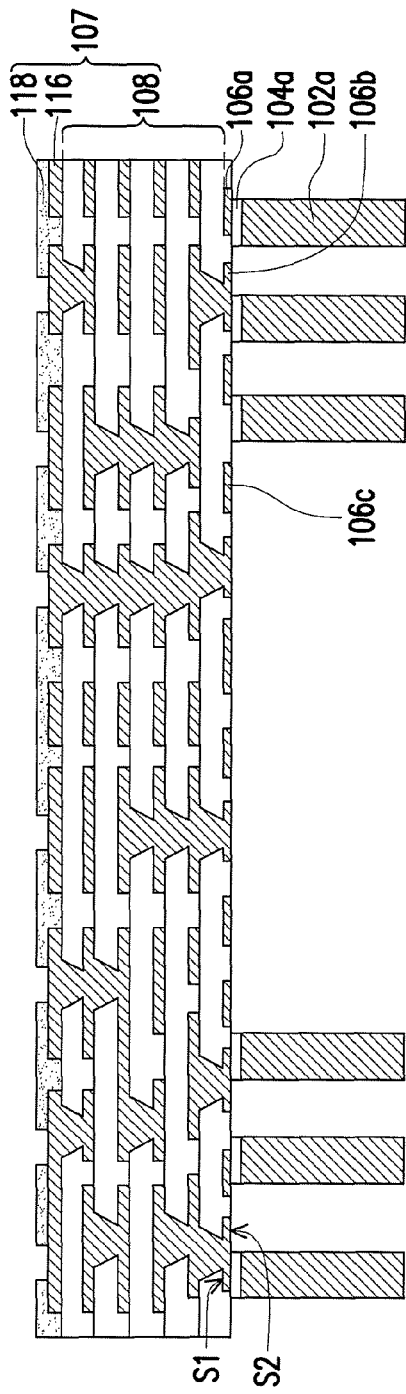

FIG. 1A to FIG. 1D are cross-sectional views of a manufacturing process of a package structure according to a first embodiment of the invention.

Referring to FIG. 1A, a substrate 100 is provided. The substrate 100 includes a first metal layer 102, a second metal layer 106 and an etching stop layer 104. The etching stop layer 104 is disposed between the first metal layer 102 and the second metal layer 106. In the present embodiment, the substrate 100 is, for example, a three-layer structure composed of Cu—Ni—Cu, or a three-layer structure composed of Cu—Al—Cu, as long as a material of the etching stop layer 104 is different to the material of the first metal layer 102 and the material of the second metal layer 106, though the invention is not limited thereto. In other embodiment, the material of the first metal layer 102 is, for example, silver, nickel, copper, aluminium, gold, palladium or a combination thereof, and a thickness thereof is between 10 μm and 150 μm. The material of the second metal layer 106 is, for example, silver, nickel, copper, aluminium, gold, palladium or a combination thereof, and a thickness thereof is between 10 μm and 80 μm. The material of the etching stop layer 104 is, for example, silver, nickel, copper, aluminium, gold, palladium or a combination thereof, and a thickness thereof is between 0.5 μm and 30 μm.

Then, referring to FIG. 1A and FIG. 1B, the second metal layer 106 is patterned to form a plurality of first contact pads 106a and 106b. The first contact pads 106a and 106 have a first surface S1 and a second surface S2 opposite to each other. In the present embodiment, the first contact pads 106a are not electrically connected to the subsequently formed conductive through vias 114. The first contact pads 106b are electrically connected to the subsequently formed conductive through vias 114.

Thereafter, a circuit board 107 is formed on the first surface S1 of the first contact pads 106a and 106b. The circuit board 107 includes a build-up structure 108, second contact pads 116 and a solder mask layer 118. In detail, the build-up structure 108 includes a plurality of dielectric layers 110, a plurality of patterned circuit layers 112 and a plurality of conductive through vias 114. Each of the patterned circuit layers 112 is disposed between the adjacent dielectric layers 110. A method for forming the patterned circuit layers 112 is, for example, to first form a photoresist layer such as a dry film (not shown) on the first contact pads 106a and 106b or on the circuit layer. Then, the photoresist layer is patterned through a photolithography process to expose one portion of the first contact pads 106a and 106b or the circuit layer. Thereafter, a electroplating process and a remove process of the photoresist layer is performed, so as to form the patterned circuit layers 112. Afterwards, the dielectric layers 110 are formed on the patterned circuit layers 112. Then, the conductive through vias 114 are formed in the dielectric layers 110, where the conductive through vias 114 are electrically connected to two adjacent patterned circuit layers 112. Although only 5-layer of the dielectric layers 110 and 5-layer of the patterned circuit layers 112 are illustrated in FIG. 1B, the invention is not limited thereto. Basically, the number of the patterned circuit layers 112 can be added according to a build-up method, and can be adjusted according to an actual design requirement. A material of the dielectric layers 110 may include a dielectric material, and the dielectric material is, for example, prepreg, ajinomoto build-up film (ABF) or a combination thereof. A material of the patterned circuit layers 112 may include a metal material, and the metal material is, for example, silver, nickel, copper, aluminium, gold, palladium or a combination thereof. In the present embodiment, the patterned circuit layers 112 can be regarded as wires on the circuit board 107, which can be designed according to a required circuit layout.

Then, the second contact pads 116 and the solder mask layer 118 are formed on the build-up structure 108. The material of the second contact pads 116 and the method for forming the same are similar to that of the aforementioned patterned circuit layer 112, which are not repeated. In the present embodiment, a material of the solder mask layer 118 is, for example, a dielectric material, an ABF layer or a combination thereof. A method for forming the solder mask layer 118 is; for example, to first form a solder mask material layer on the second contact pads 116 (not shown). Then, the solder mask material layer is patterned to expose the surface of one portion of the second contact pads 116. Moreover, a surface treatment layer can be formed on the second contact pads 116 and between the second contact pads 116 and the solder mask layer 118 (not shown). A material of the surface treatment layer is, for example, organic solderability preservative (OSP), electroplating Ni/Au, electroplating Ni/Pd, electroplating Sn, electroplating Ag, electroless Au, electroless nickel electroless palladium immersion gold (ENEPIG) or a combination thereof.

Referring to FIG. 1C, the first metal layer 102 is patterned to form a plurality of metal pillars 102a. In detail, a method for forming the metal pillars 102a is, for example, to form a patterned photoresist layer on the first metal layer 102 to expose a surface of one portion of the first metal layer 102 (not shown). Then, the etching stop layer 104 is taken as an etching stop layer to perform an etching process on the first metal layer 102, so as to form the metal pillars 102a. Thereafter, the etching stop layer 104 that is not covered by the metal pillars 102a is removed to expose the second surface S2 of the first contact pad 106c, so as to form the etching stop layer 104a covered by the metal pillars 102a. The metal pillars 102a can be electrically connected to the circuit board 107 through the etching stop layer 104a and the first contact pads 106a and 106b. In an embodiment, a height of the metal pillars can be adjusted according to subsequently formed chips 124a and 125b, which is not limited by the invention.

Figure 1D:
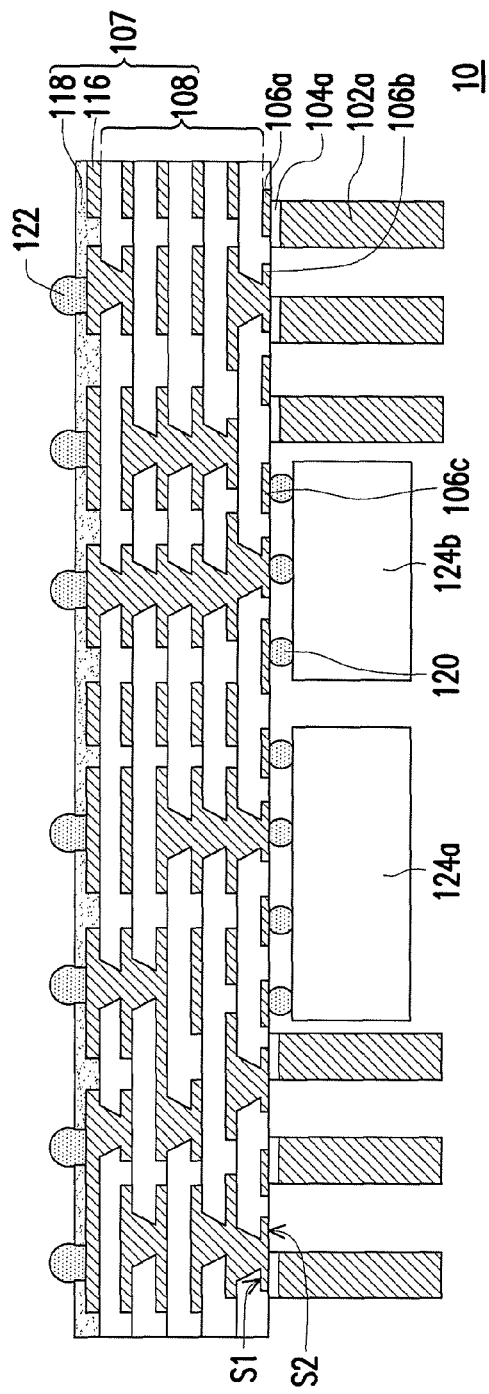

Referring to FIG. 1D, the chips 124a and 124b are formed on the second surface S2 of the first contact pads 106c. The metal pillars 102a surround the chips 124a and 124b. The chips 124a and 124b are electrically connected to the circuit board 107 through bumps 120 and the first contact pads 106c. On the other hand, a plurality of bumps 122 are also formed on the second contact pads 116 of the circuit board 107. The package structure 10 of the first embodiment can be electrically connected to other package structure through the bumps 122 to form a package-on-package (POP) structure. In FIG. 1D, only two chips 124a and 124b are illustrated, though the invention is not limited thereto. In other embodiments, the number of the chips can be adjusted according to an actual requirement.

Referring to FIG. 1D, the package structure 10 of the first embodiment includes the first contact pads 106a, 106b, 106c, the circuit board 107, the metal pillars 102a and the chips 124a and 124b. The first contact pads 106a, 106b and 106c have the first surface S1 and the second surface S2 opposite to each other. The circuit board 107 is disposed on the first surface S1 of the first contact pads 106a, 106b and 106c. The metal pillars 102a is disposed on the second surface S2 of the first contact pads 106a, 106b and 106c. The chips 124a and 124b are disposed on the second surface S2 of the first contact pads 106c. The metal pillars 102a surround the chips 124a and 124b. Since the material of the metal pillars 102a is relatively hard, and the metal pillars 102a surround the chips 124a and 124b, the structural strength of the package structure 10 of the first embodiment is strengthened. In this way, the package structure 10 of the first embodiment may resolve the warpage issue occurred in a chip bonding process, so as to improve a yield of the package structure 10.

Moreover, the method for manufacturing the package structure 10 of the embodiment is to first form the circuit board 107 on the relatively thick substrate 100. Then, an etching process is performed on the first metal layer 102 to form the metal pillars 102a. Therefore, in view of the manufacturing process, the warpage issue of the circuit board 107 made of a relatively soft material is avoided during the manufacturing process, so as to further improve the yield of the circuit board 107.

In the following embodiment, the same or similar components, members or layers are denoted by the similar referential numbers. For example, the substrate 100 and the substrates 200, 300 and 400 are the same or similar components, and the build-up structure 108 and the build-up structures 208, 308 and 408 are the same or similar components, and details thereof are not repeated.

FIG. 2A to FIG. 2D are cross-sectional views of a manufacturing process of a package structure according to a second embodiment of the invention. FIG. 3 is a top view of a supporting structure of FIG. 2B.

Figure 2A:
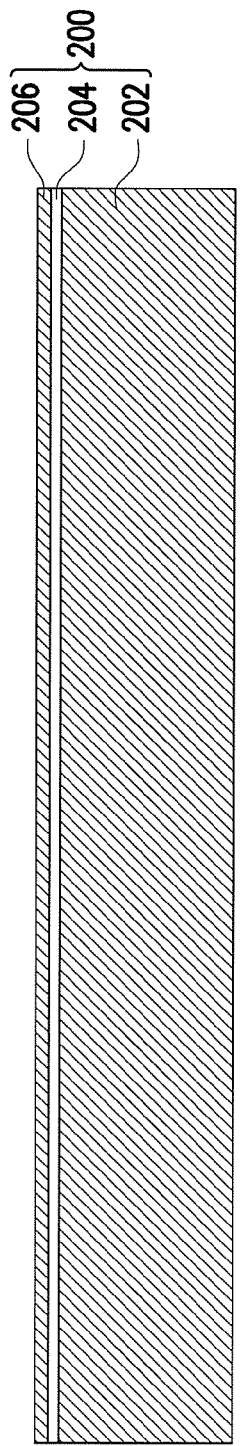
FIG. 2A to FIG. 2D are cross-sectional views of a manufacturing process of a package structure according to a second embodiment of the invention.
Figure 2B:
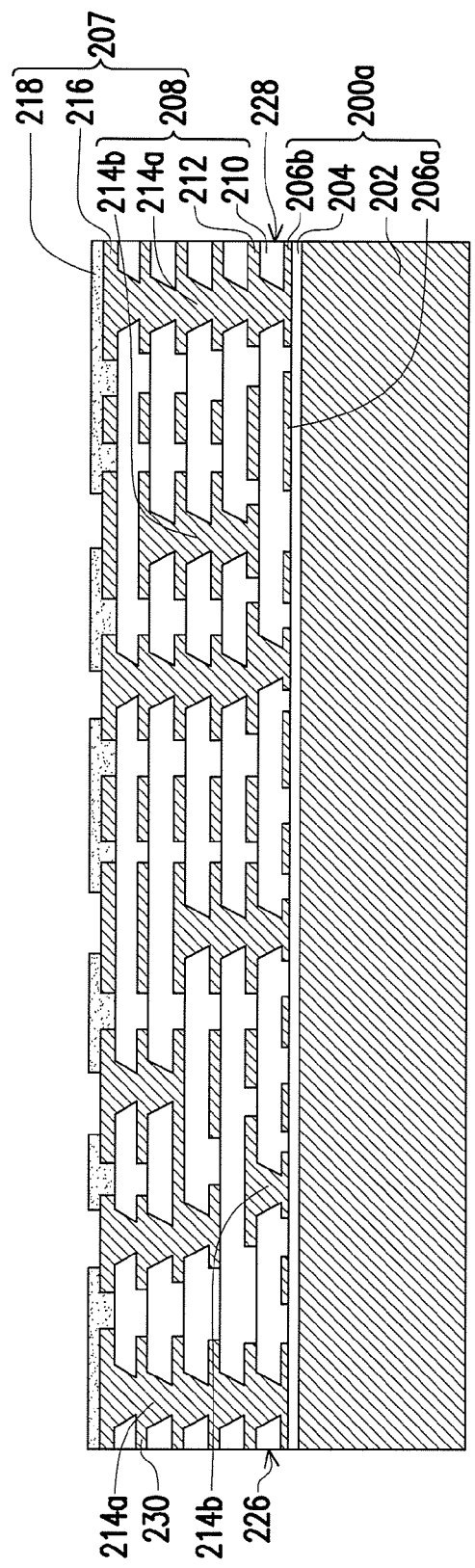
Figure 2C:
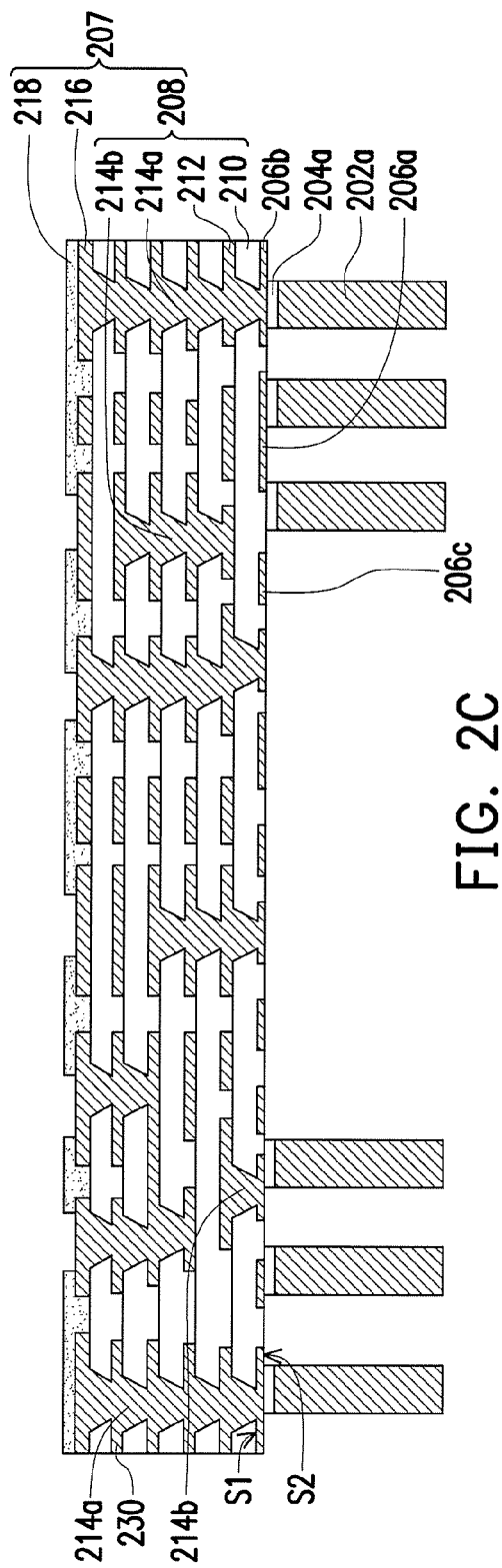
Figure 3:
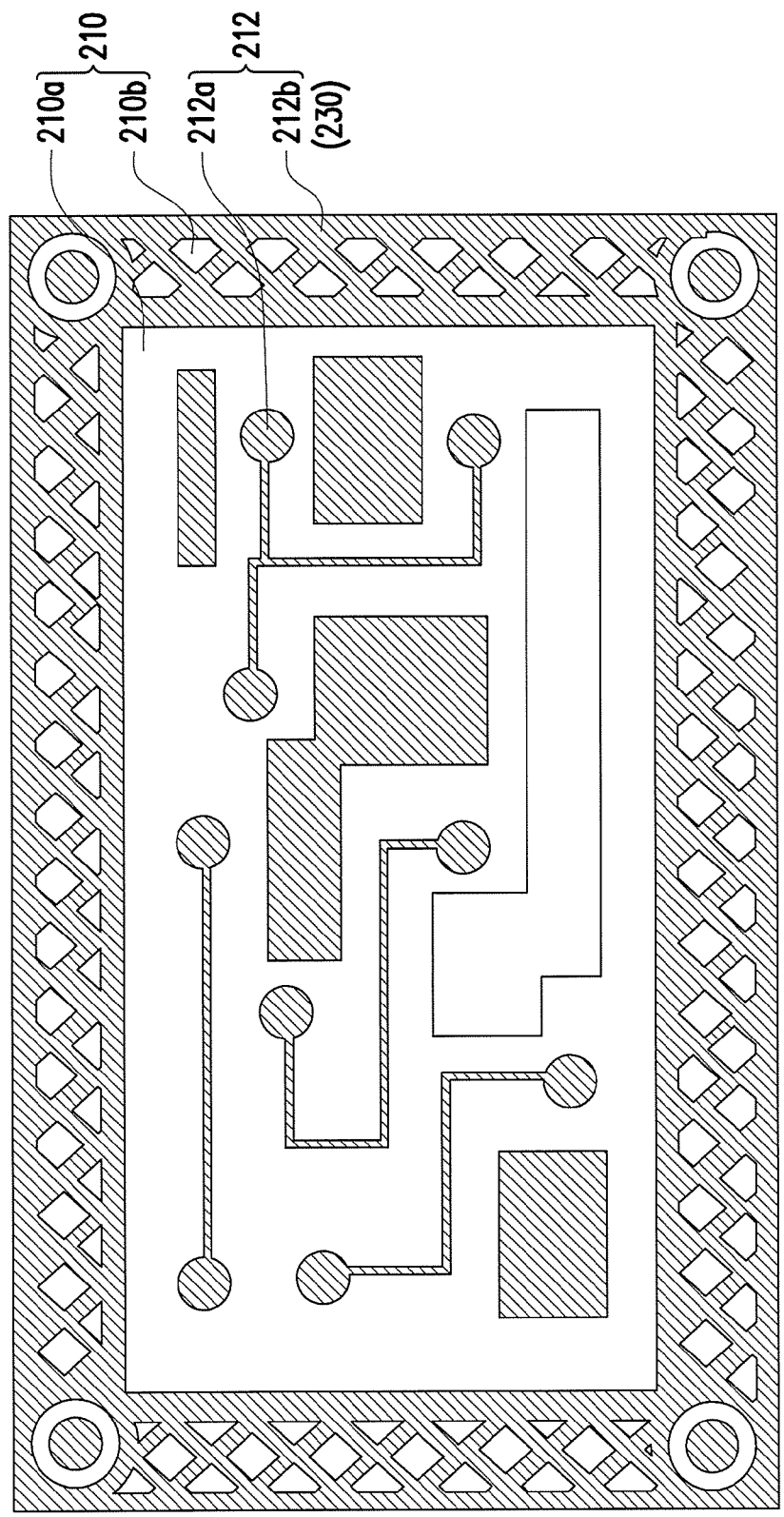
FIG. 3 is a top view of a supporting structure of FIG. 2B.

Referring to FIG. 2A to FIG. 2C, the manufacturing process of the package structure 20 of the second embodiment of the invention is basically similar to the manufacturing process of the package structure 10 of the first embodiment, and a difference therebetween is that besides the conductive through vias 214b (similar to the conductive through vias 114 of the first embodiment), the circuit board 207 of the second embodiment further has a plurality of conductive through vias 214a disposed in the dielectric layer 210. The conductive through vias 214a can be disposed around the circuit board 207 (regarding the cross-sectional view of FIG. 2B, the surrounding of the circuit board 207 can be regarded to be close to two sides 226 and 228 of the circuit board 207). The conductive through vias 214a are aligned to each other to form a continuous structure. In the present embodiment, the conductive through vias 214a disposed around the circuit board 207 and having the continuous structure can be regarded as a conductive pillar, which can serve as a vertical supporting structure. The vertical supporting structure can be used to strengthen a structural strength of the package structure 20 of the second embodiment along a vertical direction, so as to resolve the warpage issue of the package structure to improve the yield of the package structure. In the present embodiment, the conductive through vias 214a can be designed according to a required circuit layout. In other words, the conductive through vias 214a and the conductive through vias 214b can be formed together without an additional process.

Moreover, the circuit board 207 of the second embodiment has a supporting structure 230. Referring to FIG. 2B and FIG. 3, the supporting structure 230 can be regarded as a horizontal supporting structure, which can be designed according to a layout of the patterned circuit layer 212. In detail, the patterned circuit layer 212 is disposed on the dielectric layer 210. The patterned circuit layer 212 has a main pattern 212a and a supporting pattern 212b. The supporting pattern 212b is disposed around the main pattern 212a to form the horizontal supporting structure 230. The main pattern 212a can be regarded as wires originally designed on the circuit board 207. The supporting pattern 212b is disposed around the main pattern 212a to strengthen a lateral structural strength of the patterned circuit layer 212. Therefore, the supporting pattern 212b (i.e., the supporting structure 230) can resolve the warpage issue of the package structure, so as to improve the yield of the package structure. Generally, each layer of the patterned circuit layer 212 may have the supporting pattern 212b disposed around the main pattern 212a to form the horizontal supporting structure 230. Therefore, the lateral structural strength of each layer of the patterned circuit layer 212 can be enhanced without an additional process. In the present embodiment, the supporting pattern 212b is, for example, a mesh pattern.

Figure 2D:
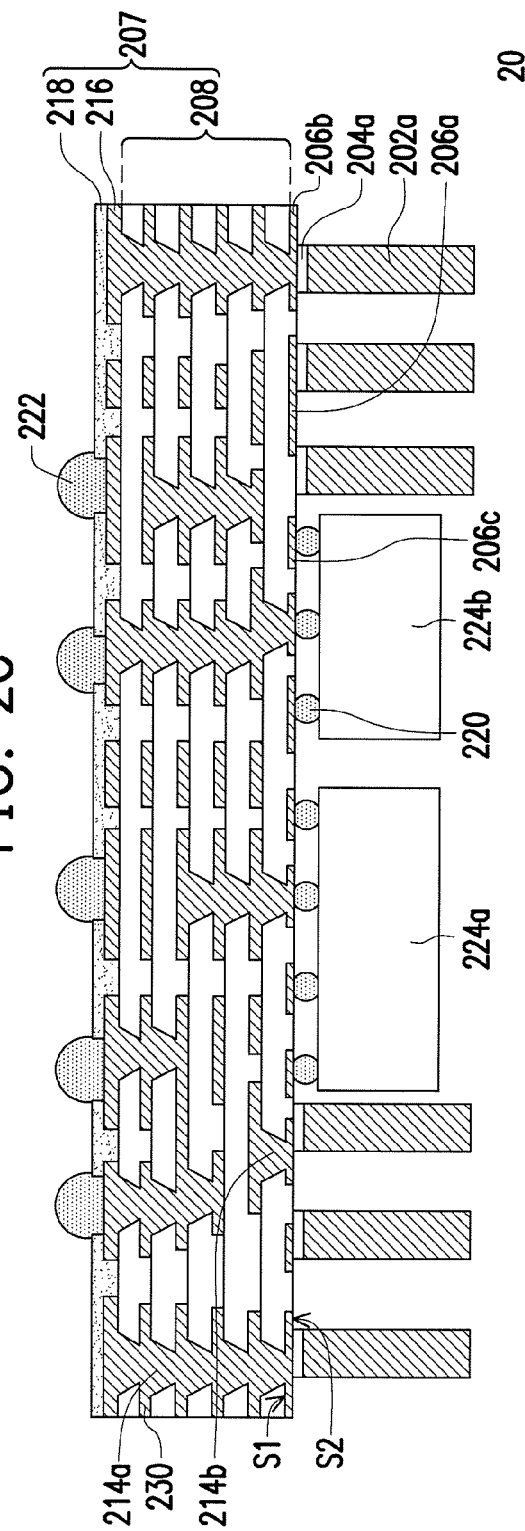

Referring to FIG. 2C and FIG. 2D, the manufacturing steps thereof are the same to that of FIG. 1C and FIG. 1D, and materials, thickness and formation methods of the metal pillars 202a, the etching stop layer 204a, the bumps 220, 222 and the chips 224a and 224b are the same to that of the metal pillars 102a, the etching stop layer 104a, the bumps 120, 122 and the chips 124a and 124b of the first embodiment, so that details thereof are not repeated.

Figure 5:
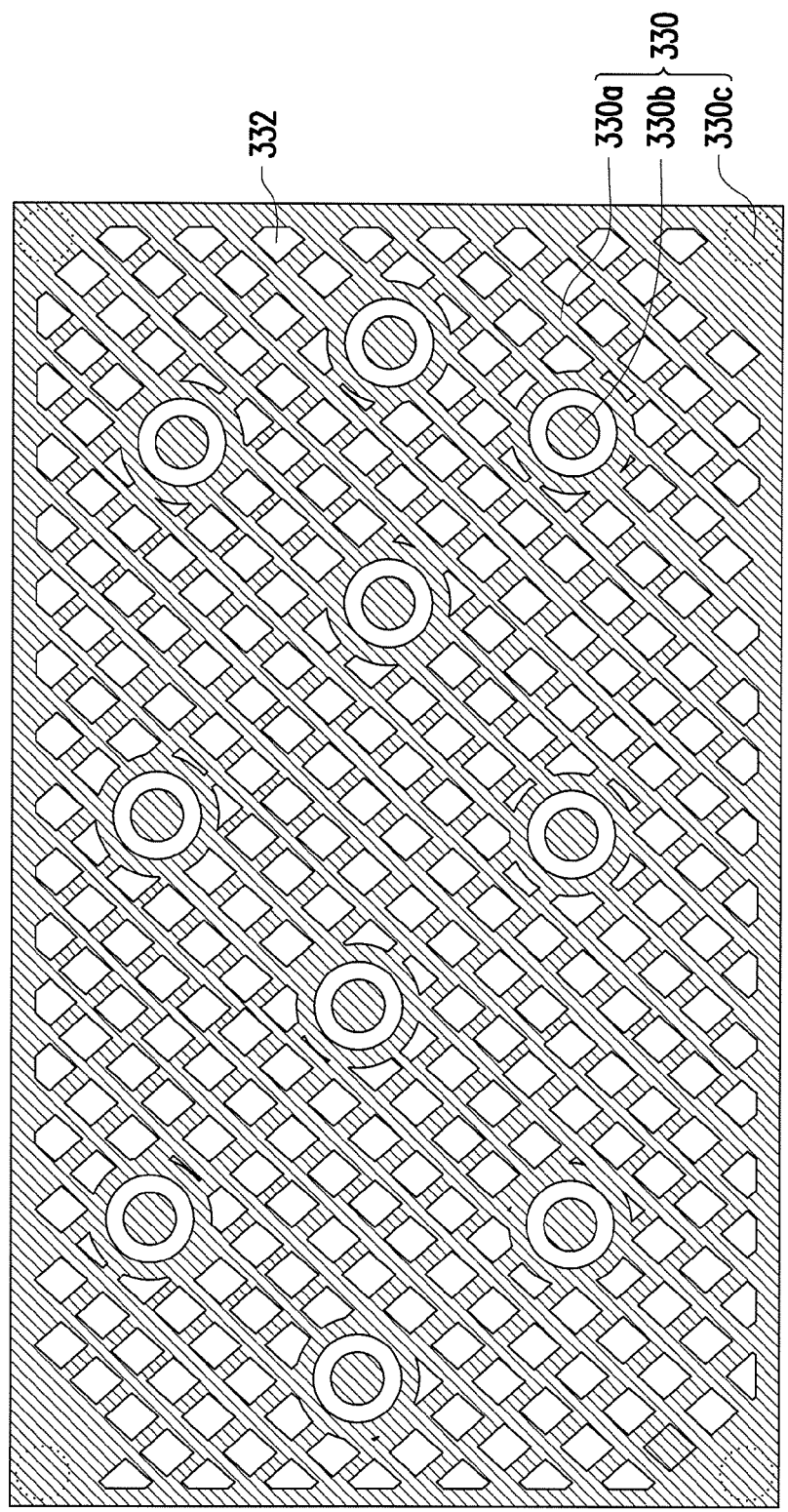
FIG. 5 is a top view of a heat dissipation structure of FIG. 4A.

FIG. 4A to FIG. 4D are cross-sectional views of a manufacturing process of a package structure according to a third embodiment of the invention. FIG. 5 is a top view of a heat dissipation structure of FIG. 4A.

The manufacturing process of the package structure 30 of the third embodiment of the invention is basically similar to the manufacturing process of the package structure 20 of the second embodiment. Referring to FIG. 4A, FIG. 2B and FIG. 5, a difference between the embodiments of FIG. 4A and FIG. 2B is that the circuit board 307 of the third embodiment further has the first heat dissipation structure 330 and a dielectric layer 332 disposed between the build-up structure 308 and the second contact pads 316. As shown in FIG. 4A, the first heat dissipation structure 330 is electrically connected to the vertical supporting structure 314a (i.e., the conductive through vias 314a) to form an inverted U-shape structure. In detail, the first heat dissipation structure 330 can be regarded as another layer of the patterned circuit layer 312 disposed between the build-up structure 308 and the second contact pads 316. As shown in FIG. 5, the pattern of the first heat dissipation structure 330 includes a mesh pattern 330a, a conductive through via pattern 330b and a corner pattern 330c. The dielectric layer 332 is disposed on the first heat dissipation structure 330. The mesh pattern 330a is not only used for increasing a heat dissipation performance of the package structure 30 of the third embodiment, but also is further used for strengthening a lateral structural strength of the package structure 30 of the third embodiment. The conductive through via pattern 330b is used for electrically connecting the build-up structure 308 and the second contact pads 316. The corner pattern 330c can be electrically connected to the vertical supporting structure 314a (i.e., the conductive through via 314a) to form an inverted U-shape structure. Therefore, the corner pattern 330c not only increases a heat dissipation performance of the package structure 30 of the third embodiment, but also enhances the structural strength of the package structure 30 of the third embodiment along the vertical direction. In the present embodiment, a material of the first heat dissipation structure 330 may include a metal material, and the metal material is, for example, silver, nickel, copper, aluminium, gold, palladium or a combination thereof. A material of the dielectric layer 332 may include a dielectric material, and the dielectric material is, for example, prepreg, an ABF layer or a combination thereof.

Referring to FIG. 4B and FIG. 4C, the manufacturing steps thereof are the same to that of FIG. 2C and FIG. 2D, and materials, thickness and formation methods of the metal pillars 302a, the etching stop layer 304a, the bumps 320, 322 and the chips 324a and 324b are the same to that of the metal pillars 202a, the etching stop layer 204a, the bumps 220, 222 and the chips 224a and 224b of the second embodiment, so that details thereof are not repeated.

Referring to FIG. 4D, a second heat dissipation structure 334 is formed on a third surface S3 of the chips 324a and 324b. The second heat dissipation structure 334 may enhance the heat dissipation performance of the package structure 30 of the third embodiment to decrease a temperature of the whole package structure 30. In the present embodiment, a material of the second heat dissipation structure 334 is, for example, silver, nickel, copper, aluminium, gold, palladium or a combination thereof.

FIG. 6A to FIG. 6E are cross-sectional views of a manufacturing process of a package structure according to a fourth embodiment of the invention.

Referring to FIG. 6A to FIG. 6D, the manufacturing process of the package structure 40 of the fourth embodiment of the invention is basically similar to the manufacturing process of the package structure 10 of the first embodiment. Materials, thickness and formation methods of the metal pillars 402a, the etching stop layer 404a, the first contact pads 406a, 406b and 406c, the circuit board 407, the bumps 420, 422 and the chips 424a and 424b are the same to that of the metal pillars 102a, the etching stop layer 104a, the first contact pads 106a, 106b and 106c, the circuit board 107, the bumps 120, 122 and the chips 124a and 124b of the first embodiment, so that details thereof are not repeated.

Figure 6A:
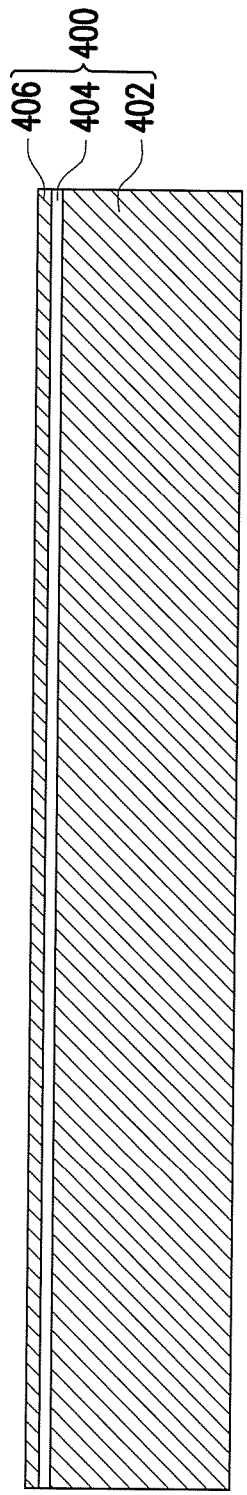
FIG. 6A to FIG. 6E are cross-sectional views of a manufacturing process of a package structure according to a fourth embodiment of the invention.
Figure 6B:
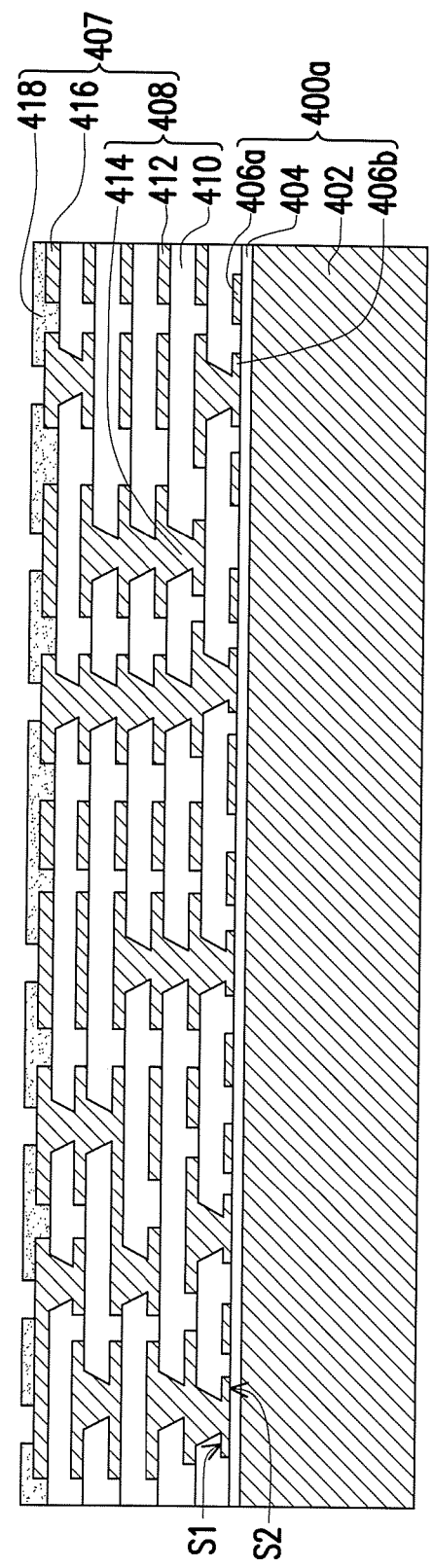
Figure 6C:
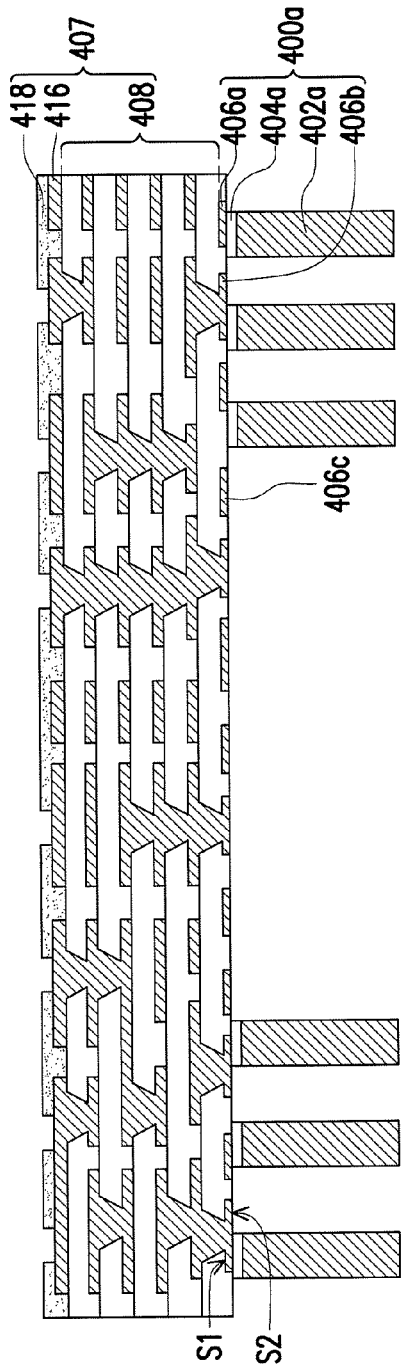
Figure 6D:
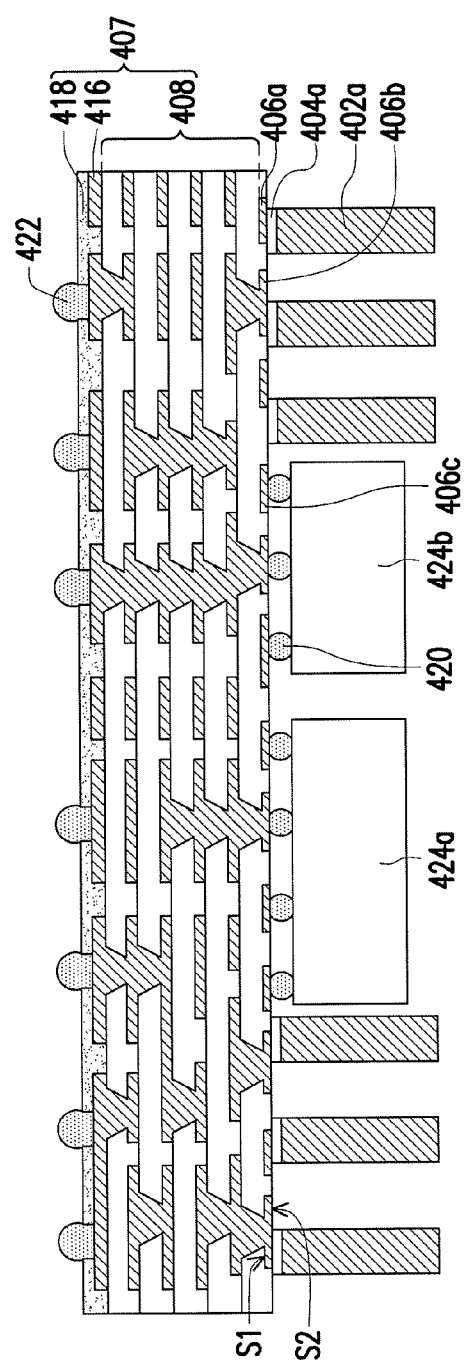
Figure 6E:
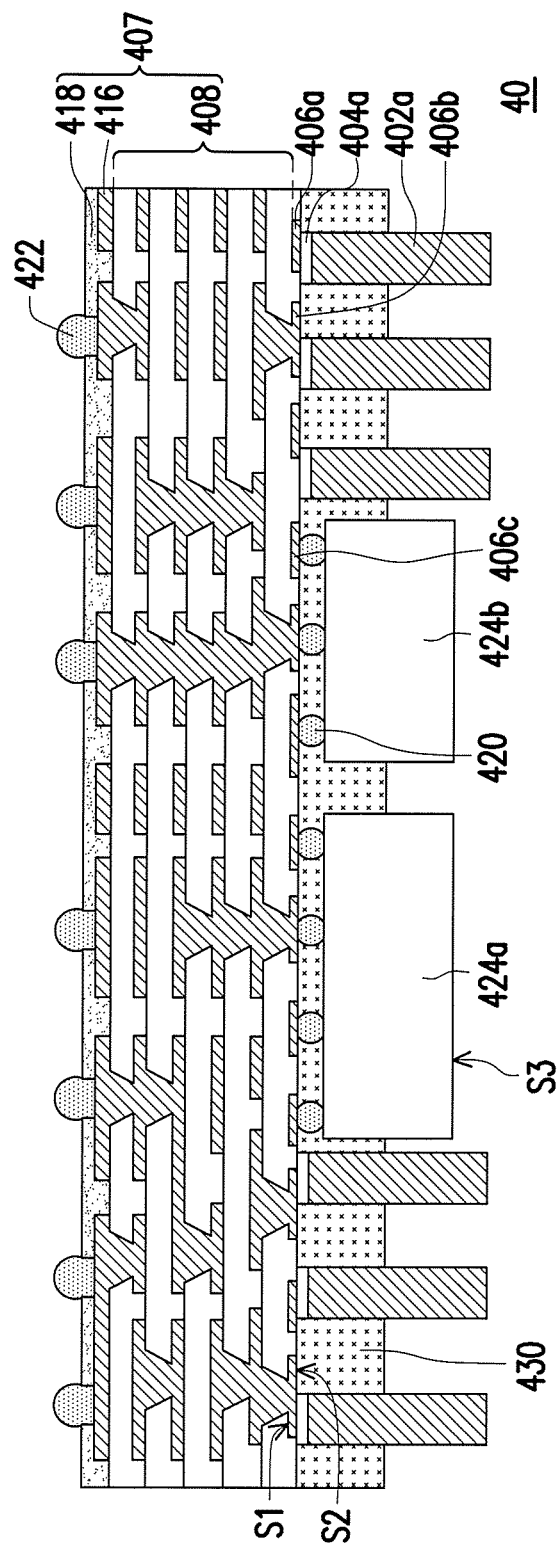

Referring to FIG. 6E, different to the package structure 10 of the first embodiment, the package structure 40 of the fourth embodiment has an insulating structure 430 disposed on the second surface S2 of the first contact pads 406a, 406b and 406c. The insulating structure 430 does not cover the third surface S3 of the chips 424a and 424b. In an embodiment, a material of the insulating structure 430 is, for example, epoxy, polyimide or a combination thereof. A method for forming the insulating structure 430 is; for example, to first form an insulating structure material layer on the second surface S2 of the first contact pads 406a, 406b and 406c. Then, a curing process is performed, so as to form the insulating structure 430. Since the material of the insulating structure 430 is relatively hard, the insulating structure 430 can strengthen the structural strength of the package structure 40 of the fourth embodiment. It should be noticed that since a thickness of the insulating structure 430 is smaller than a thickness of the chips 424a and 424b, and the insulating structure 430 does not cover the third surface s3 of the chips 424a and 424b, a confliction between the chips 424a and 424b is avoided. In an embodiment, the thickness of the insulating structure 430 can be between 10 μm and 100 μm.

In summary, the supporting structure disposed in the circuit board and the insulating structure disposed on the second surface of the first contact pads are used to enhance a strength of the package structure, so as to resolve the warpage issue of the package structure to further improve a yield of the package structure. Also, the first heat dissipation structure and the second heat dissipation structure are adopted in the invention, by which not only a temperature of the package structure is decreased, but also the strength of the package structure is further enhanced.

Moreover, the manufacturing method of the invention is to first form the circuit board on the relatively thick substrate. Then, the first metal layer is etched to form a plurality of metal pillars. In this way, in view of the manufacturing process, the warpage issue of the circuit board made of a relatively soft material is avoided during the manufacturing process, so as to enhance the yield of the circuit board.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A package structure, comprising:
   a circuit board, wherein the circuit board comprises a build-up structure, second contact pads and a solder mask layer, and the second contact pads are disposed between the build-up structure and the solder mask layer;
   a supporting structure, disposed in the circuit board, wherein the supporting structure comprises a vertical supporting structure;
   a first heat dissipation structure, disposed in the circuit board and between the build-up structure and the second contact pads, wherein the first heat dissipation structure is electrically connected to the vertical supporting structure to form an inverted U-shape structure;
   a plurality of first contact pads, disposed on the circuit board;
   at least one chip, disposed on one portion of the first contact pads; and
   a plurality of metal pillars, disposed on the other portion of the first contact pads, wherein the metal pillars surround the chip.

2. The package structure as claimed in claim 1, wherein the build-up structure comprises:
   a plurality of dielectric layers;
   a plurality of patterned circuit layers, each of the patterned circuit layers being disposed between the adjacent dielectric layers; and
   a plurality of first conductive through vias, disposed in the dielectric layer, and electrically connecting the adjacent patterned circuit layers.

3. The package structure as claimed in claim 2, wherein the supporting structure further comprises a horizontal supporting structure.

4. The package structure as claimed in claim 3, wherein each of the patterned circuit layers has a main pattern and a supporting pattern, the supporting pattern is disposed around the main pattern to form the horizontal supporting structure, wherein the supporting pattern is a mesh pattern.

5. The package structure as claimed in claim 2, wherein the vertical supporting structure has a plurality of second conductive through vias disposed in the dielectric layer and disposed around the circuit board, the second conductive through vias are aligned to each other to form a continuous structure.

6. The package structure as claimed in claim 1, further comprising a second heat dissipation structure disposed on the chip.

7. The package structure as claimed in claim 6, wherein a material of the second heat dissipation structure comprises silver, nickel, copper, aluminium, gold, palladium or a combination thereof.

8. The package structure as claimed in claim 1, further comprising:
   an insulating structure, disposed on the first contact pads, wherein the insulating structure does not cover a surface of the chip.

9. The package structure as claimed in claim 8, wherein a material of the insulating structure comprises epoxy, polyimide or a combination thereof.

10. The package structure as claimed in claim 1, further comprising:
    a plurality of bumps, disposed between the first contact pads and the chip; and
    a plurality of etching stop layers, disposed between the first contact pads and the metal pillars.

* * * * *